US010371969B2

(12) United States Patent
Jang et al.

(10) Patent No.: US 10,371,969 B2
(45) Date of Patent: Aug. 6, 2019

(54) ELECTRONIC DEVICE

(71) Applicant: SAMSUNG ELECTRONICS CO., LTD., Suwon-si, Gyeonggi-do (KR)

(72) Inventors: Eun Joo Jang, Suwon-si (KR); Chil Hee Chung, Seoul (KR); Tae Hyung Kim, Seoul (KR); Jihyun Min, Seoul (KR); Hyo Sook Jang, Suwon-si (KR); Dae Young Chung, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 56 days.

(21) Appl. No.: 15/671,369

(22) Filed: Aug. 8, 2017

(65) Prior Publication Data
US 2018/0039103 A1     Feb. 8, 2018

(30) Foreign Application Priority Data
Aug. 8, 2016 (KR) .................. 10-2016-0100917

(51) Int. Cl.
*H01L 51/50* (2006.01)
*G02F 1/017* (2006.01)
(Continued)

(52) U.S. Cl.
CPC .......... *G02F 1/01716* (2013.01); *C09K 11/00* (2013.01); *C09K 11/70* (2013.01);
(Continued)

(58) Field of Classification Search
CPC .... G02F 1/01716; G02F 2/02; G02F 1/01725; G02F 2001/01791; G02F 1/3556; H01L 51/502; B82Y 20/00
See application file for complete search history.

(56) References Cited

U.S. PATENT DOCUMENTS

2007/0024174 A1   2/2007   Kim et al.
2007/0054426 A1   3/2007   Yang et al.
(Continued)

FOREIGN PATENT DOCUMENTS

| JP | 2014078380 A | 5/2014 |
| KR | 1020070014641 A | 2/2007 |
| KR | 1020150078396 A | 7/2015 |

OTHER PUBLICATIONS

Achermann, M., et al., "Energy-transfer pumping of semiconductor nanocrystals using an epitaxial quantum well", Nature, vol. 429, Jun. 10, 2004, pp. 642-646.
(Continued)

*Primary Examiner* — Moin M Rahman
(74) *Attorney, Agent, or Firm* — Cantor Colburn LLP

(57) ABSTRACT

An electronic device includes: an anode and a cathode facing each other; a quantum dot emission layer disposed between the anode and the cathode and including a plurality of quantum dots; and a light emitting source, wherein the quantum dot emission layer is configured to receive electrical energy from the anode and the cathode and to emit light having a first wavelength, wherein the quantum dot emission layer and the light emitting source are configured so that the light emitting source provides the quantum emission layer with light having a second wavelength, and the plurality of quantum dots are excited by the light having the second wavelength and emit light having a third wavelength, wherein the anode, the cathode, or a combination thereof is a light transmitting electrode, and the light of the first wavelength and the light of the third wavelength are emitted through the light transmitting electrode.

11 Claims, 8 Drawing Sheets

(51) Int. Cl.
*G02F 2/02* (2006.01)
*C09K 11/00* (2006.01)
*C09K 11/70* (2006.01)
*H05B 33/14* (2006.01)
*B82Y 20/00* (2011.01)
*G02F 1/355* (2006.01)

(52) U.S. Cl.
CPC ............ *G02F 1/01725* (2013.01); *G02F 2/02* (2013.01); *H01L 51/502* (2013.01); *H05B 33/14* (2013.01); *B82Y 20/00* (2013.01); *G02F 1/3556* (2013.01); *G02F 2001/01791* (2013.01)

(56) References Cited

U.S. PATENT DOCUMENTS

| | | | |
|---|---|---|---|
| 2014/0231753 A1* | 8/2014 | Chen | H01L 27/322 257/40 |
| 2016/0028036 A1 | 1/2016 | Xue | |
| 2016/0079316 A1* | 3/2016 | Zhou | H01L 51/5278 257/13 |

OTHER PUBLICATIONS

Chen et al., "Transparent organic light-emitting devices with LiF/Mg:Ag cathode", Optics Express, vol. 13, No. 3, Feb. 7, 2005, pp. 937-941.

McCarthy et al., "Low-Voltage, Low-Power, Organic Light-Emitting Transistors for Active Matrix Displays", Science, vol. 332, Apr. 29, 2011, pp. 570-573.

Michele Muccini, "A bright future for organic field-effect transistors", Nature Materials, vol. 5, Aug. 2006, pp. 605-613.

Saxena et al., "A review on the light extraction techniques in organic electroluminescent devices", Optical Materials, 32, 2009, pp. 221-233.

Zhao et al., "Analysis of Internal Quantum Efficiency and Current Injection Efficiency in III-Nitride Light-Emitting Diodes", Journal of Display Technology, vol. 9, No. 4, Apr. 2013, pp. 212-225.

Zhao et al., "Analysis of light extraction efficiency enhancement for thin-film-flip-chip InGaN quantum wells light-emitting diodes with GaN micro-domes", Optics Express, vol. 20, No. S5, Sep. 7, 2012, pp. A765-A776.

* cited by examiner

ELECTRONIC DEVICE

CROSS-REFERENCE TO RELATED APPLICATION

This application claims priority to and the benefit of Korean Patent Application No. 10-2016-0100917 filed in the Korean Intellectual Property Office on Aug. 8, 2016, and all the benefits accruing therefrom under 35 U.S.C. § 119, the content of which in its entirety is herein incorporated by reference.

BACKGROUND

1. Field

An electronic device is disclosed.

2. Description of the Related Art

A quantum dot, for example, a semiconductor nanocrystal, having different energy bandgaps, may be prepared by controlling the size and the composition of the nanocrystals, and thus may emit light of various photoluminescent wavelengths.

SUMMARY

Provided is an electronic device capable of realizing improved quantum efficiency and relatively high luminance simultaneously.

Also provided is a display including the electronic device.

An embodiment provides an electronic device including:
an anode and a cathode facing each other;
a quantum dot light-emission layer (hereinafter, referred to as a quantum dot emission layer) disposed between the anode and the cathode and including a plurality of quantum dots; and
an excitation light emitting source, and
wherein the quantum dot emission layer is configured to receive electrical energy from the anode and the cathode and to emit light having a first wavelength,
wherein the quantum dot emission layer and the excitation light emitting source are configured so that the excitation light emitting source provides the quantum dot emission layer with light having a second wavelength of about 300 nanometers (nm) to about 490 nm, and the plurality of quantum dots in the quantum dot emission layer are excited by the light of the second wavelength and emit light having a third wavelength that is greater than the second wavelength,
wherein at least one of the anode and the cathode is a light transmitting electrode, and
wherein the light having the first wavelength and the light having the third wavelength are emitted through the light transmitting electrode.

The electronic device may further include a first hole injection layer (HIL), a first hole transport layer (HTL), a first electron blocking layer (EBL), or a combination thereof disposed between the anode and the quantum dot emission layer.

The electronic device may further include a first electron injection layer (EIL), a first electron transport layer (ETL), a first hole blocking layer (HBL), or a combination thereof disposed between the cathode and the quantum dot emission layer.

The excitation light emitting source may be configured so that the light having the second wavelength passes through the light transmitting electrode before being provided to the quantum dot emission layer.

The excitation light emitting source may include a light emitting transistor.

The light emitting transistor may include a gate electrode; a channel overlapping at least a portion of the gate electrode and including an electroluminescence material; an insulator disposed between the gate electrode and the channel; and a source electrode and a drain electrode electrically connected with the channel.

The gate electrode may be a reflecting electrode.

The light having the first wavelength and the light having the third wavelength may pass through the cathode;
the anode may have a first surface and a second surface opposite the first surface;
the first surface of the anode may face the quantum dot emission layer; and
the light emitting transistor may be disposed on the second surface of the anode.

The cathode may include the drain electrode.

The light emitting transistor may be configured so that charge transport may occur in a direction perpendicular to the first surface.

The light having the first wavelength and the light having the third wavelength may pass through the cathode;
the anode may have a first surface and a second surface opposite the first surface;
the first surface of the anode may face to the quantum dot emission layer;
the second surface of the anode may face to the channel layer of the light emitting transistor.

The light emitting transistor may be configured so that charge transport may occur in a direction horizontal to the first surface.

The channel may include a hole auxiliary layer facing the source electrode, an electron auxiliary layer facing the drain electrode, and an emission layer disposed between the hole auxiliary layer and the electron auxiliary layer and including an electroluminescent material.

The hole auxiliary layer may include a second hole injection layer (HIL), a second hole transport layer (HTL), a second electron blocking layer (EBL), or a combination thereof.

The electron auxiliary layer may include a second electron injection layer (EIL), a second electron transport layer (ETL), a second hole blocking layer (HBL), or a combination thereof.

The excitation light emitting source may include a light emitting diode.

The light emitting diode may include a first electrode, a second electrode, and an electroluminescent layer disposed between the first electrode and the second electrode and including an electro-luminescence material.

In another embodiment, a display including the electronic device is provided.

The electronic devices of the embodiments may be operated under a dual mode and thereby they may realize high quantum efficiency together with enhanced brightness.

BRIEF DESCRIPTION OF THE DRAWINGS

The above and other aspects, advantages and features of this disclosure will become more apparent by describing in further detail exemplary embodiments thereof with reference to the accompanying drawings, in which.

DETAILED DESCRIPTION

Figure 1:
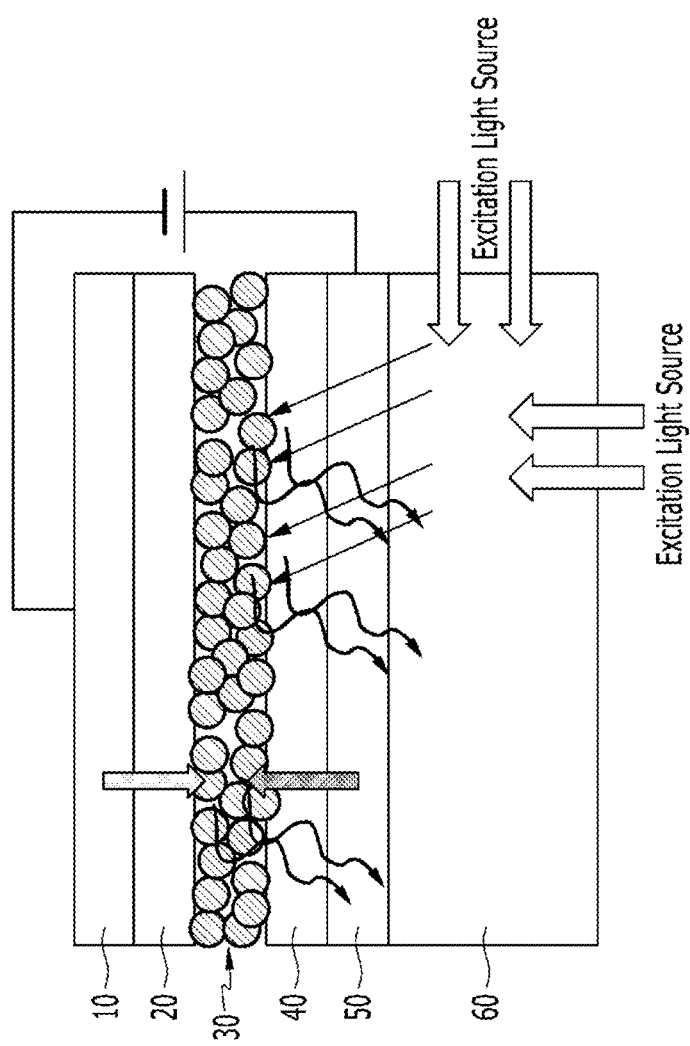
FIG. 1 is schematic cross-sectional view of an electronic device according to an embodiment.

Exemplary embodiments will hereinafter be described in detail, and may be easily performed by those who have common knowledge in the related art. However, this disclosure may be embodied in many different forms and is not construed as limited to the exemplary embodiments set forth herein. Rather, these embodiments are provided so that this disclosure will be thorough and complete, and will fully convey the scope of the invention to those skilled in the art. Like reference numerals refer to like elements throughout.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

In the drawings, parts having no relationship with the description are omitted for clarity of the embodiments, and the same or similar constituent elements are indicated by the same reference numerals throughout the specification.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±10%, 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

As used herein, unless otherwise provided, the term "substituted" refers to replacement of hydrogen of a compound or group with at least one (e.g., 1, 2, 3, or 4) substituent independently a C1 to C30 alkyl group, a C2 to C30 alkynyl group, a C6 to C30 aryl group, a C7 to C30 alkylaryl group, a C1 to C30 alkoxy group, a C1 to C30 heteroalkyl group, a C3 to C30 heteroalkylaryl group, a C3 to C30 cycloalkyl group, a C3 to C30 cycloalkenyl group, a C3 to C30 cycloalkynyl group, a C2 to C30 heterocycloalkyl group, a halogen (—F, —Cl, —Br or —I), a hydroxy group (—OH), a nitro group (—NO$_2$), a cyano group (—ON), an amino group (—NRR' wherein R and R' are independently hydrogen or a C1 to C6 alkyl group), an azido group (—N$_3$), an amidino group (—O(=NH)NH$_2$), a hydrazino group (—NHNH$_2$), a hydrazono group (=NNH$_2$), an aldehyde group (—C(=O)H), a carbamoyl group (—C(O)NH$_2$), a thiol group (—SH), an ester group (—O(=O)OR, wherein R is a C1 to C6 alkyl group or a C6 to C12 aryl group), a carboxyl group (—COOH) or a salt thereof (—O(=O)OM, wherein M is an organic or inorganic cation), a sulfonic acid group (—SO$_3$H) or a salt thereof (—SO$_3$M, wherein M is an organic or inorganic cation), a phosphoric acid group (—PO$_3$H$_2$) or a salt thereof (—PO$_3$MH or —PO$_3$M$_2$, wherein M is an organic or inorganic cation), or a combination thereof, provided that the substituted atom's normal valence is not exceeded.

The quantum dot has a theoretical quantum yield (QY) of 100% and emits light having a high color purity (e.g., a full width at half maximum (FWHM) of less than or equal to about 40 nm), the use of a quantum dot as a light emitting material may provide increased luminescent efficiency and improved color reproducibility. In a wet chemical method used to prepare the quantum dot, organic materials such as a dispersing agent are coordinated on the surface of a semiconductor crystal during crystal growth. As a result, quantum dots having a uniformly controlled size, and having good photoluminescent characteristics and stability may be provided.

Accordingly, quantum dots may be applied to various types of electronic devices, including for example, a display device. Thus, it is desirable to develop an electronic device (e.g., an optoelectronic device) having a structure capable of fully utilizing the unique properties (e.g., high quantum efficiency) of quantum dots.

An electronic device according to an embodiment includes a cathode and an anode facing each other and a quantum dot emission layer disposed between the cathode and the anode, and further includes an excitation light emitting source (e.g., a light emitting source configured to emit light having a wavelength capable of exciting quantum dots). The cathode may include an electron injection conductor (e.g., metal) having a low work function. The anode may be a hole injection conductor having a high work function of greater than or equal to about 4.0 electron volts (eV) (e.g., a metal such as tungsten, nickel, cobalt, platinum, or palladium, a metal oxide such as gallium indium oxide, or indium tin oxide, or a conductive polymer having a high work function such as polyethylene dioxythiophene). The excitation light emitting source may emit light having a wavelength of less than or equal to about 400 nanometers (nm), for example, less than or equal to about 390 nm, less than or equal to about 380 nm, or less than or equal to about 370 nm.

The quantum dot emission layer is configured to receive electrical energy provided from the anode and the cathode and to emit light having a first wavelength. For example, when voltage is applied between the anode and the cathode, holes and electrons (e.g., injected into a charge (hole) auxiliary layer disposed adjacent to the anode or into a charge (electron) auxiliary layer disposed adjacent to the cathode) are each transported to an oppositely charged electrode, respectively. The holes and the electrons are positioned on the plurality of quantum dots in the quantum dot emission layer, and the holes and electrons recombine to generate excitons and emit light having a first wavelength. The excitation light emitting source provides light having a second wavelength ranging from about 300 nm to about 490 nm to the quantum dot emission layer, and thereby the quantum dot is excited by the light having the second wavelength and emits light having a third wavelength which is greater than the second wavelength. The light of the second wavelength passes through the anode or the cathode, entering the quantum dot emission layer.

At least one of the cathode and the anode may be a light transmitting electrode or a transparent electrode. In an embodiment, both the anode and the cathode may be a light transmitting (e.g., translucent or transparent) electrodes. The electrode may be patterned.

The light transmitting electrode may include (e.g., may be made of), for example, a transparent conductor such as indium tin oxide (ITO), indium zinc oxide (IZO), gallium indium tin oxide, zinc indium tin oxide, titanium nitride, polyaniline, LiF/Mg:Ag, or a thin monolayer or multilayer of a metal thin film, but is not limited thereto. In some embodiments, one of the cathode and the anode may be a non-light transmitting electrode, being made of, for example, an opaque conductor such as aluminum (Al), a lithium aluminum (Li:Al) alloy, a magnesium-silver alloy (Mg:Ag), or a lithium fluoride-aluminum alloy (LiF:Al).

The light of the first wavelength and the light of the third wavelength are emitted through the light transmitting electrode. The light transmitting electrode may be disposed on the transparent substrate. The substrate may be rigid or flexible. The substrate may be a plastic, glass, or a metal.

A thickness of the anode or the cathode is not particularly limited and may be selected by considering the device efficiency. For example, the thickness of the anode (or the cathode) may be greater than or equal to about 5 nm, or greater than or equal to about 25 nm, or for example, greater than or equal to about 50 nm. For example, the thickness of the anode (or the cathode) may be less than or equal to about 100 micrometers (μm), for example, less than or equal to about 10 μm, or less than or equal to about 1 μm, less than or equal to about 900 nm, less than or equal to about 500 nm, or less than or equal to about 100 nm.

The quantum dot emission layer includes a quantum dot, specifically, a plurality of quantum dots. The type of quantum dot (hereinafter, also referred to as a semiconductor nanocrystal) is not particularly limited and may be prepared using a method known to those of skill in the art, or may be commercially available. For example, the quantum dot may be a Group II-VI compound, a Group III-V compound, a Group IV-VI compound, a Group IV element or compound, a Group compound, a Group I-II-IV-VI compound, or a combination thereof.

The Group II-VI compound may be a binary element including CdSe, CdTe, ZnS, ZnSe, ZnTe, ZnO, HgS, HgSe, HgTe, MgSe, MgS, or a combination thereof; a ternary element compound including CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, or a combination thereof; or a quaternary element compound including HgZnTeS, CdZnSeS, CdZnSeTe, CdZnSTe, CdHgSeS, CdHgSeTe, CdHgSTe, HgZnSeS, HgZnSeTe, HgZnSTe, or a combination thereof. The Group II-VI compound may further include a Group III metal.

The Group III-V compound may be a binary element compound including GaN, GaP, GaAs, GaSb, AlN, AlP, AlAs, AlSb, InN, InP, InAs, InSb, or a combination thereof; a ternary element compound including GaNP, GaNAs, GaNSb, GaPAs, GaPSb, AlNP, AlNAs, AlNSb, AlPAs, AlPSb, InNP, InNAs, InNSb, InPAs, InPSb, or a combination thereof; or a quaternary element compound including GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, or a combination thereof. The Group III-V compound may further include a Group II metal such as Zn.

The Group IV-VI compound may be a binary element compound including SnS, SnSe, SnTe, PbS, PbSe, PbTe, or a combination thereof; a ternary element compound including SnSeS, SnSeTe, SnSTe, PbSeS, PbSeTe, PbSTe, SnPbS, SnPbSe, SnPbTe, or a combination thereof; or a quaternary element compound including SnPbSSe, SnPbSeTe, SnPbSTe, or a combination thereof.

Examples of the Group compound may include $CuInSe_2$, $CuInS_2$, CuInGaSe, CuInGaS, or a combination thereof, but are not limited thereto. The Group I-II-IV-IV compound may include CuZnSnSe, CuZnSnS, or a combination thereof, but are not limited thereto. The Group IV compound may include a single-element compound including Si, Ge, or a combination thereof; or a binary element compound including SiC, SiGe, or a combination thereof. The Group II-VI compound may further include a Group III metal. The Group III-V compound may further include a Group II metal.

The binary element compound, the ternary element compound, or the quaternary element compound respectively, are present in a uniform concentration in the semiconductor nanocrystal particle or may be present in different concentrations within the same particle (e.g., non-uniform concentration/distribution). The semiconductor nanocrystal may include a core including a first semiconductor nanocrystal and a shell disposed on at least a portion of the surface of the core and including a second semiconductor nanocrystal having a composition different from the first semiconductor nanocrystal. In some embodiments, the semiconductor nanocrystal may not have a shell. The core and shell may have an interface, and an element of the core, the shell, or a combination thereof, may be at the interface and may have a concentration gradient wherein the concentration of the element(s) decreases from the shell towards the core. In addition, the semiconductor nanocrystal may have a core including a semiconductor nanocrystal and a multi-layered shell surrounding the core. In some embodiments, the multi-layered shell may have a shell structure including at least two layers, wherein each layer may independently include a single composition, an alloy, or may be the layer having a concentration gradient, respectively.

In the semiconductor nanocrystal particle, a material constituting the shell may have a larger energy bandgap than the energy bandgap of the core, and thereby the semiconductor nanocrystal may exhibit a quantum confinement effect more effectively. In the case of a multi-layered shell semiconductor nanocrystal particle, the bandgap of the material constituting an outer layer of the shell may be higher energy than the bandgap of the material constituting an inner layer of the shell (i.e., a shell layer that is closer to the core). In this case, the semiconductor nanocrystal may emit light having a wavelength ranging from an ultraviolet (UV) wavelength to an infrared wavelength, or from about 400 nm to about 700 nm. The semiconductor nanocrystal may emit blue light, green light, or red light, but is not limited thereto.

The semiconductor nanocrystal may have quantum efficiency of greater than or equal to about 10%, greater than or equal to about 30%, for example, greater than or equal to about 50%, greater than or equal to about 60%, greater than or equal to about 70%, greater than or equal to about 90%, or about 100%.

The semiconductor nanocrystal may have a narrow light emitting spectrum. In some embodiments, the photoluminescent spectrum of the semiconductor nanocrystal may have a full width at half maximum (FWHM) of less than or equal to about 45 nm, for example less than or equal to about 40 nm, or less than or equal to about 30 nm.

The quantum dot may have a particle diameter (an average largest particle diameter for a non-spherical shape) of about 1 nm to about 100 nm. For example, the quantum dots may have a particle diameter (an average largest particle diameter for a non-spherical shape) of about 1 nm to about 50 nm, for example, may be greater than or equal to about 2 nm, greater than or equal to about 3 nm, greater than or equal to about 4 nm, greater than or equal to about 5 nm, greater than or equal to about 6 nm, or greater than or equal to about 7 nm and less than or equal to about 30 nm, less than or equal to about 25 nm, less than or equal to about 20 nm, or less than or equal to about 15 nm.

The shape of the quantum dots is not particularly limited, and may include, for example, e a spherical shape, a pyramidal shape, an ellipsoidal shape, a multi-armed shape, a cube, a polyhedral shape, a nanotube, a nanowire, a nanofiber, a nanosheet, or a combination thereof.

The quantum dot may be commercially available or may be synthesized according to any suitable method. For example, a quantum dot of several nanometers may be synthesized using a wet chemical process. In the wet chemical process, a precursor material reacts in an organic solvent to grow nanocrystal particles, and the organic solvent or a ligand compound may be coordinated to a surface thereof, thereby controlling the growth of the nanocrystal particles. Examples of the organic solvent and ligand compound are not limited and may be determined by the person of skill in the art without undue experimentation. The organic solvent coordinated to the surface of the quantum dot may affect stability of a device including the quantum dot, and thus an excess amount of an organic material not being coordinated to the surface of the quantum dot may be removed by adding an excess amount of a non-solvent thereto, and centrifuging the resulting mixture. Examples of the non-solvent may include acetone, ethanol, methanol, or the like, but are not limited thereto.

The quantum dot may include an organic ligand having a hydrophobic residue group bound to the surface. In an embodiment, the organic ligand having the hydrophobic residue group may include $RCOOH$, $RNH_2$, $R_2NH$, $R_3N$, $RSH$, $R_3PO$, $R_3P$, $ROH$, $RCOOR'$, $RPO(OH)_2$, $R_2POOH$ (wherein, R and R' are independently a C5 to C24 substituted or unsubstituted aliphatic hydrocarbon group, for example, an alkyl group or an alkenyl group, or a C5 to C20 substituted or unsubstituted aromatic hydrocarbon group, for example an aryl group), or a combination thereof.

Specific examples of the organic ligand may include thiol compounds such as methane thiol, ethane thiol, propane thiol, butane thiol, pentane thiol, hexane thiol, octane thiol, dodecane thiol, hexadecane thiol, octadecane thiol, or benzyl thiol; amines such as methane amine, ethane amine, propane amine, butane amine, pentyl amine, hexyl amine, octyl amine, nonyl amine, decyl amine, dodecyl amine, hexadecyl amine, octadecyl amine, dimethyl amine, diethyl amine, dipropyl amine, tributyl amine, or trioctyl amine; carboxylic acid compounds such as methanoic acid, ethanoic acid, propanoic acid, butanoic acid, pentanoic acid, hexanoic acid, heptanoic acid, octanoic acid, dodecanoic acid, hexadecanoic acid, octadecanoic acid, oleic acid, or benzoic acid; phosphine compounds such as methyl phosphine, ethyl phosphine, propyl phosphine, butyl phosphine, pentyl phosphine, octylphosphine, dioctyl phosphine, tributylphosphine, or trioctylphosphine; phosphine compounds or phosphine oxide compounds such as methyl phosphine oxide, ethyl phosphine oxide, propyl phosphine oxide, butyl phosphine oxide pentyl phosphine oxide, tributyl phosphine oxide, octyl phosphine oxide, dioctyl phosphine oxide, or trioctyl phosphine oxide, diphenyl phosphine, triphenyl phosphine, diphenyl phosphine oxide, or triphenyl phosphine oxide; a C5 to C20 alkyl phosphonic acid, a C5 to C20 alkyl phosphinic acid (e.g., hexyl phosphinic acid, octyl phosphinic acid, dodecane phosphinic acid, tetradecane phosphinic acid, hexadecane phosphinic acid, or octadecane phosphinic acid); or the like, but are not limited thereto. The organic ligand may be a single compound or may be a combination of any of the foregoing compounds.

In a non-limiting embodiment, the quantum dot emission layer may consist essentially of, or consist of, a plurality of quantum dots. In an embodiment, the quantum dot emission layer may include, consist essentially of, or consist of a quantum dot monolayer. Alternatively, in other embodiments, the quantum dot emission layer may be included in the electron/hole auxiliary layer that will be described later.

When a voltage is applied to an anode and a cathode of an electroluminescent device including a quantum dot, charge transfer may occur in a direction perpendicular to the quantum dot emission layer (e.g., perpendicular to a surface of the quantum dot emission layer) and, optionally, perpendicular to a surface of the electron and hole injection layers disposed on opposite surfaces of the quantum dot emission layer, and consequently the injected electrons or holes may be recombined at the quantum dot to form excitons and may emit a photon. The external quantum efficiency (EQE) of the device may be proportional to the internal quantum efficiency, and the internal quantum efficiency (IQE) of a quantum dot itself may be theoretically about 100%. However, as the quantum dot based electroluminescent device is operated, the internal quantum efficiency thereof is inversely proportional to the current density (units of ampere per cubic centimeter, A/cm2). In other words, as the current density increases (e.g., at a current density of greater than about 100 A/cm$^2$), the IQE may suffer a significant decrease. Some of the QD-LED device may show the maximum EQE at a current density significantly smaller than about 10 milliampere per square centimeter (mA/cm$^2$). In order to maintain the internal quantum efficiency at a desirable level, the QD-LED may be operated at a low current density, but in this case, it becomes difficult to obtain a desirable level of brightness for the device. For example, the device shows a luminescent efficiency significantly lower than that of the fluorescent OLED such as the QD-LED.

In the electronic device according to the embodiments, when a voltage is applied to the anode and the cathode, the quantum dot is excited by the electron injected from the anode and the hole injected from the cathode and thereby emits light of a first wavelength. Simultaneously, the quantum dots accept the light having the second wavelength of greater than or equal to about 300 nm, for example, greater than or equal to 350 nm, greater than or equal to 400 nm, greater than or equal to 420 nm, greater than or equal to 430 nm, greater than or equal to 440 nm, greater than or equal to 450 nm, greater than or equal to 460 nm and of less than or equal to about 490 nm, for example, of less than or equal to about 480 nm or of less than or equal to about 470 nm and is excited thereby to emit light having a third wavelength which is greater than the second wavelength. Accordingly, without being bound by any particular theory, it is believed that as the electronic device according to the embodiments is further excited at a predetermined current density, it may show improved internal quantum efficiency together with increased luminance and luminescent efficiency at the same time.

The quantum dot emission layer may have a thickness of about 10 nm to about 1000 nm, but is not limited thereto. For example, the quantum dot emission layer may have a thickness of greater than or equal to about 10 nm, for example, greater than or equal to about 20 nm. For example, the quantum dot emission layer may have a thickness of less than or equal to about 1000 nm, for example, less than or equal to about 500 nm. Within the above-described thickness ranges, luminescent efficiency and light extraction efficiency of a device are improved.

The electronic device may further include a charge auxiliary layer (e.g., a hole auxiliary layer) between the anode and the quantum dot emission layer. The charge auxiliary layer (e.g., a hole auxiliary layer) may include, for example, a first hole injection layer (HIL) to facilitate hole injection, a first hole transport layer (HTL) to facilitate hole transport, a first electron blocking layer (EBL) to inhibit electron transport, or a combination thereof. The electronic device may further include a charge auxiliary layer (e.g., an electron auxiliary layer) between the cathode and the quantum dot emission layer. The charge auxiliary layer may include, for example, a first electron injection layer (EIL) to facilitate electron injection, a first electron transport layer (ETL) to facilitate electron transport, a first hole blocking layer (HBL) to inhibit hole transport, or a combination thereof.

The charge auxiliary layer may include, for example, an organic material, an inorganic material, or an organic/inorganic material. The organic material may be an organic compound having hole or electron properties, and the inorganic material may be, for example, a metal oxide such as molybdenum oxide, tungsten oxide, zinc oxide, or nickel oxide.

The hole transport layer (HTL) may include a compound including, for example, poly (3,4-ethylenedioxythiophene): poly(styrene sulfonate (PEDOT:PSS), poly(9,9-dioctyl-fluorene-co-N-(4-butylphenyl)-diphenylamine (TFB), polyarylamine, poly(N-vinylcarbazole), polyaniline, polypyrrole, N,N,N',N'-tetrakis(4-methoxyphenyl)-benzidine (TPD), 4-bis[N-(1-naphthyl)-N-phenyl-amino]biphenyl (α-NPD), 4,4',4"-tris[phenyl(m-tolyl)amino]triphenylamine (m-MTDATA), 4,4',4"-tris(N-carbazolyl)-triphenylamine (TCTA), 1,1-bis[(di-4-tolylamino) phenylcyclohexane (TAPC), or a combination thereof, but is not limited thereto.

The electron blocking layer (EBL) may include a compound including, for example, poly(3,4-ethylenedioxythiophene):poly(styrene sulfonate) (PEDOT:PSS), poly (9,9-dioctyl-fluorene-co-N-(4-butylphenyl)-diphenylamine (TFB) polyarylamine, poly(N-vinylcarbazole), polyaniline, polypyrrole, N,N,N',N'-tetrakis (4-methoxyphenyl)-benzidine (TPD), 4-bis[N-(1-naphthyl)-N-phenyl-amino]biphenyl (α-NPD), m-MTDATA, 4,4',4"-tris(N-carbazolyl)-triphenylamine (TCTA), or a combination thereof, but is not limited thereto.

The electron transport layer (ETL) may include a compound including, for example, 1,4,5,8-naphthalene-tetracarboxylic dianhydride (NTCDA), bathocuproine (BCP), tris [3-(3-pyridyl)-mesityl]borane (3TPYMB), LiF, tris(8-hydroxyquinolato)aluminum (Alq3), tris(8-hydroxyquinolato)gallium (Gaq3) indium(III) tris(8-quinolinolato) (Inq3), bis(8-hydroxyquinolato)(Znq2), Bis (2-(2-hydroxyphenyl)benzothiazolate) zinc (II) (Zn(BTZ)2), Bis(10-hydroxybenzo[h]quinolinato)beryllim (BeBq2), or a combination thereof, but is not limited thereto.

The hole blocking layer (HBL) may include a compound including, for example, 1,4,5,8-naphthalene-tetracarboxylic dianhydride (1,4,5,8-naphthalene-tetracarboxylic dianhydride, NTCDA), bathocuproine (BCP), tris[3-(3-pyridyl)-mesityl]borane (3TPYMB), LiF, Alq3, Gaq3, Inq3, Znq2, Zn(BTZ)2, BeBq2, or a combination thereof, but is not limited thereto.

Figure 2:
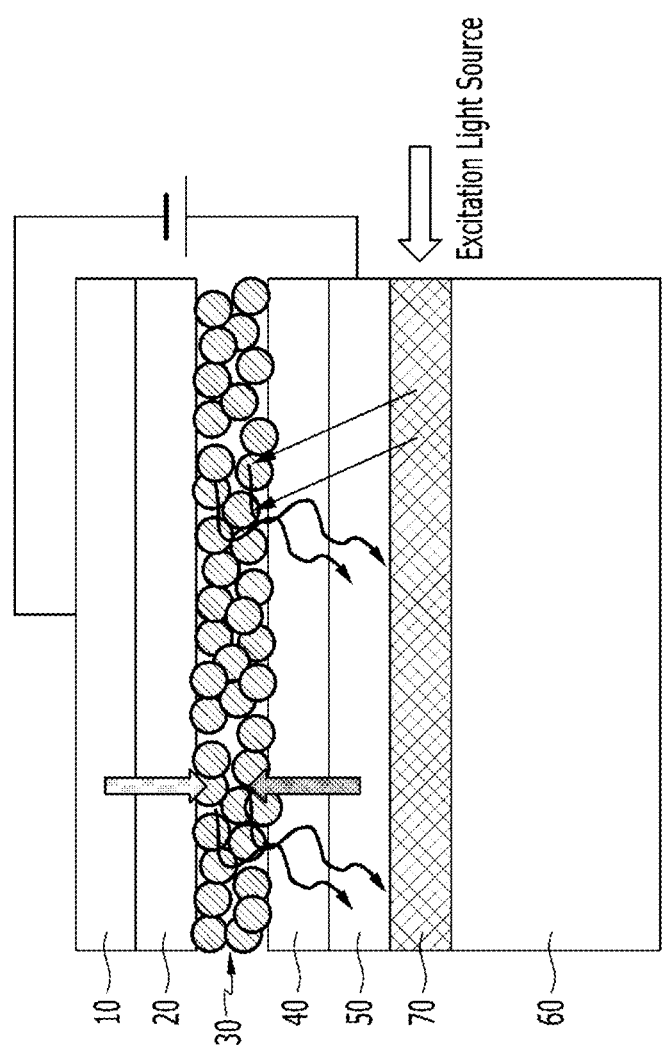
FIG. 2 is schematic cross-sectional view of an electronic device according to another embodiment.

FIGS. 1 and 2 are schematic views of electronic devices according to example embodiments. Referring to FIGS. 1 and 2, the electronic device according to some embodiments includes a transparent substrate 60, a cathode 10 and an anode 50 facing each other and a quantum dot emission layer 30 between the cathode 10 and the anode 50, and further includes an excitation light emitting source (not shown). The electronic device also includes an electron transport layer 20, a hole transport layer 40, and may also include a light guide panel 70.

The quantum dot in the quantum dot emission layer 30 receives electrical energy provided from the anode 50 and the cathode 10 and emits light having a first wavelength, and the excitation light emitting source provides the quantum dots in the quantum dot emission layer 30 with light having a second wavelength from about 300 nm to about 490 nm. (See FIG. 1) The quantum dots are excited by the light having the second wavelength and emit light having a third wavelength which is greater than the second wavelength. The light of the second wavelength enters the quantum dot emission layer through the anode 50 or the cathode 10. In the present embodiment, the excitation light emitting source may be configured so that the light having the second wavelength passes through the light transmitting electrode before being provided to the quantum dot emission layer 30. The light having the second wavelength may be provided by a light transmitting electrode (e.g., an anode) by a light guide, etc. (See FIG. 2).

In another embodiment, the excitation light emitting source may be a light emitting transistor.

The light emitting transistor may include a gate (G) electrode, a channel having at least a portion thereof overlapping with the gate electrode (G) and including an electroluminescence material, an insulator 80 disposed between the gate electrode (G) and the channel; and a source (S) electrode and a drain (D) electrode electrically connected with the channel. The electroluminescence material may include a semiconductor. The channel may further include a hole auxiliary layer facing the source electrode, an electron auxiliary layer facing the drain electrode, and a light emitting layer disposed between the hole auxiliary layer and the electron auxiliary layer and including an electroluminescence material.

The hole auxiliary layer may include a second hole injection layer (HIL), a second hole transport layer (HTL), a second electron blocking layer (EBL), or a combination thereof.

The electron auxiliary layer may include a second electron injection layer (EIL), a second electron transport layer (ETL), a second hole blocking layer (HBL), or a combination thereof.

The gate electrode may be a light transmitting electrode, and the light emitted from the channel may pass through the gate electrode and then enter into the quantum dot emission layer. Alternatively, the gate electrode may be a reflecting electrode.

Figure 3:
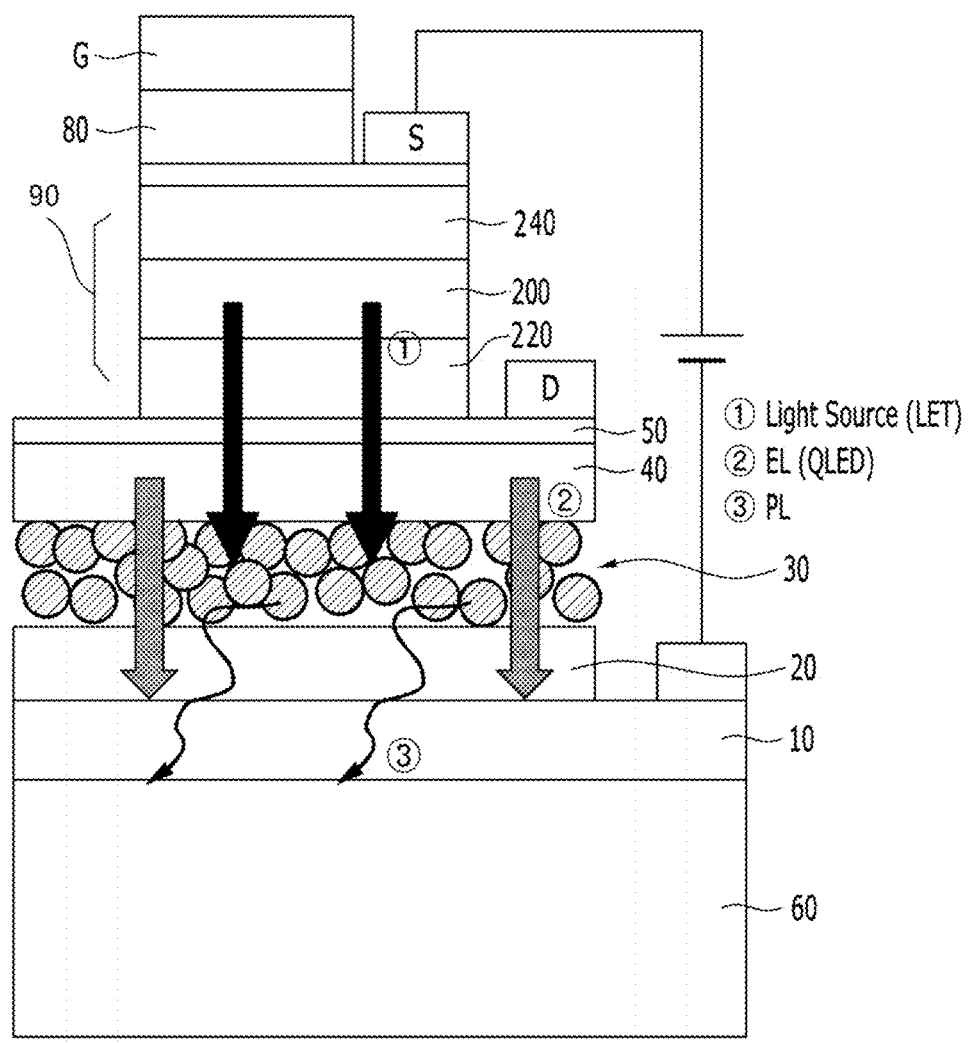
FIG. 3 is a schematic cross-sectional view of an electronic device according to yet another embodiment.

In an embodiment, the electronic device may include a light emitting transistor (LET) 1 as set forth above and may have a structure shown in FIG. 3.

Referring to FIG. 3, the Light source includes an LET 1 that includes a gate (G) electrode (e.g., a reflecting electrode), a channel 90 having at least a portion thereof overlapping with the gate electrode (G) and including an electroluminescence material, an insulator 80 disposed between the gate electrode (G) and the channel 90; and a source (S) electrode and a drain (D) electrode electrically connected with the channel. In FIG. 3, the channel 90 includes a second HTL 240, a second ETL 220, and a light emitting layer including an electroluminescent material 200 disposed between the second HTL and the second ETL. In FIG. 3, the light of the first wavelength (denoted as a grey straight arrow) and the light of the third wavelength (denoted as a black curved line arrow) may be passing through the cathode 10. The light of the second wavelength (denoted as a black solid straight arrow) emitted from the LET 1 may reach the quantum dot emission layer 30. The anode 50 may include a first surface and a second surface opposite the first surface; and the first surface of the anode 50 faces the quantum dot emission layer 30 disposed between a first HTL 40 and a first ETL 20; and the light emitting transistor 1 is disposed on the second surface of the anode 50. In some embodiments, the anode 50 may include a drain electrode. In some embodiments, the cathode 10 disposed on a substrate (glass) 60 may include the drain (D) electrode. In the light emitting transistor 1 of the device shown in FIG. 3, the charge transport may be occur in a direction perpendicular to the first surface of the anode.

Figure 4:
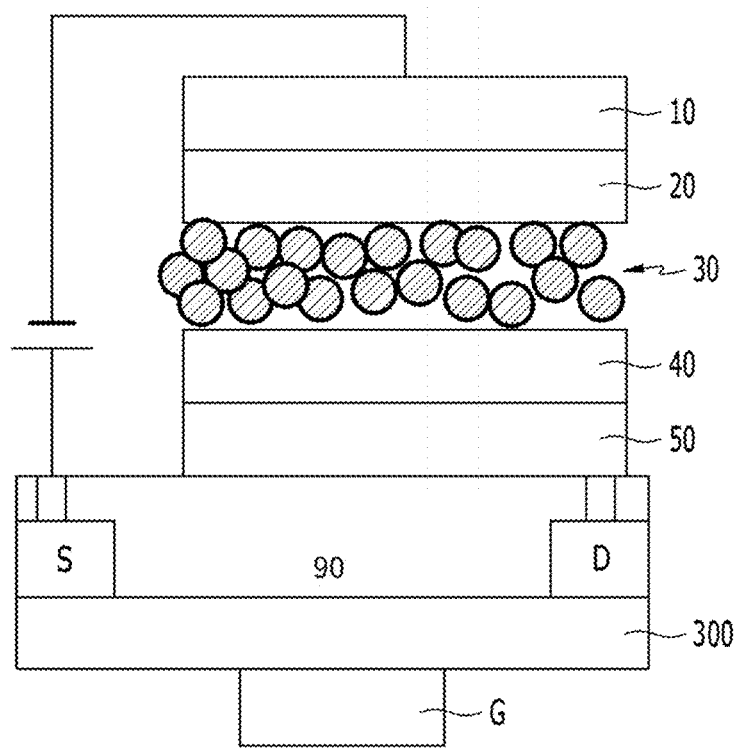
FIG. 4 is a schematic cross-sectional view of an electronic device according to another embodiment.

Referring to FIG. 4, the Light source includes an LET 1 that includes a gate (G) electrode (e.g., a reflecting electrode), a channel 90 having at least a portion thereof overlapping with the gate electrode (G) and including an electroluminescence material (e.g., electroluminescence organic compound), an gate dielectric 300 disposed between the gate electrode (G) and the channel 90; and a source (S) electrode and a drain (D) electrode electrically connected with the channel. In this embodiment, the electronic device includes a cathode 10 and an anode 50 facing each other and a quantum dot emission layer 30 between the cathode 10 and the anode 50. The electronic device also includes an electron transport layer 20 and a hole transport layer 40.

In FIG. 4, the light having the first wavelength and the light having the third wavelength may pass through the cathode 10 (light transmitting cathode including LiF/Mg: Ag, etc.), the anode 50 includes a first surface and a second surface opposite the first surface, the first surface of the anode 50 faces the quantum dot emission layer 30, and the second surface of the anode 50 faces the channel 90 of the light emitting transistor 1.

Figure 5A:
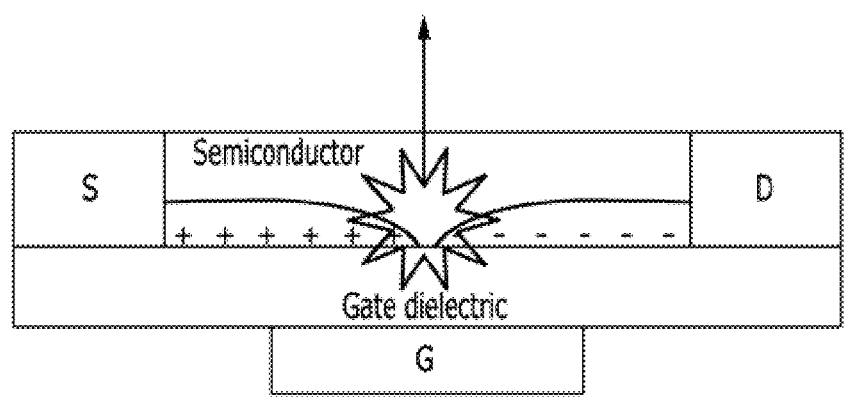
FIGS. 5A and 5B are views schematically showing charge transport and light emission in the light emitting transistor of the electronic device shown in FIG. 4.
Figure 5B:
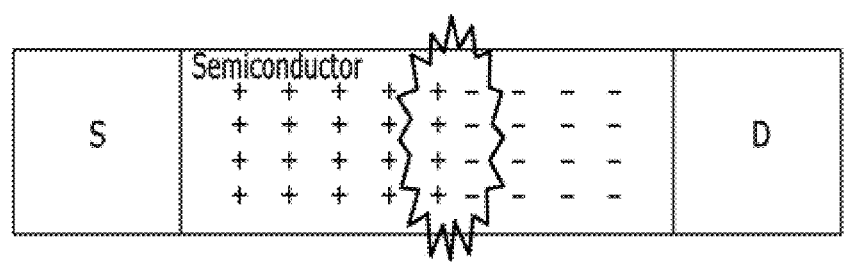

In the light emitting transistor 1 shown in FIG. 4, the charge transport occurs in a direction parallel to the channel 90 (See FIGS. 5A and 5B), and the light having the second wavelength emitted from the channel 90 may pass through the anode 50 and reach the quantum dots in the quantum dot emission layer. The anode 50 may be a light transmitting or transparent electrode.

The drain (D) electrode may include any material (e.g., 1 nm LiF/Al 100 nm) suitable for use as a drain electrode for a thin film transistor, but is not limited thereto. The source (S) electrode may also include materials (e.g., ITO, dilute CNT network, etc.) suitable for use in a source electrode of a thin film transistor, but is not limited thereto.

The electroluminescent material included in the channel may include any electroluminescent organic compound capable of emitting light having the second wavelength, and is not limited thereto. The electroluminescent material may include a host material. For example, the electroluminescent material may include fac-tris(2-phenylpyridinato)iridium (III) (Ir(ppy)3, green emitter), bis[(4,6-di-fluorophenyl)-pyridinato-N,C2']picolinate (Firpic, blue emitter), or the like. The host material may include an 4,4-N,N-dicarbazole-biphenyl emitter host (CBP, green), an N,N'-dicarbazolyl-3, 5-benzene emitter host (mCP, blue), or the like, but is not limited thereto.

The gate (G) electrode may include any material suitable for use as a gate electrode in a thin film transistor (e.g., a thin film transistor having a thickness of 100 nm or less). One or more of the source (S) electrode, the drain (D) electrode, and the gate (G) electrode may be a light transmitting electrode. The insulation layer 80 may include any material that is suitable for use as an insulation layer in a thin film transistor.

In another embodiment, the excitation light emitting source may be a light emitting diode.

The light emitting diode may include a first electrode (e.g., an anode), a second electrode (e.g., a cathode), and an electroluminescence layer disposed between the first electrode and the second electrode and including an electroluminescent material. The first electrode and the second electrode are the same as described above. The electroluminescent material may include an organic electroluminescent material that emits light having a second wavelength.

Hereinafter, the present disclosure is illustrated in more detail with reference to examples. However, these examples are exemplary, and the present disclosure is not limited thereto.

EXAMPLES

Reference Example: Preparation of Quantum Dot

1) Synthesis of InP core 0.2 mmol of indium acetate, 0.6 mmol of palmitic acid, and 10 mL of 1-octadecene are input into a reactor and heated at 120° C. under a vacuum. After one hour, the atmosphere of the reactor is replaced with nitrogen. After being heated at 280° C., a mixed solution of 0.1 mmol of tris(trimethylsilyl)phosphine (TMS3P) and 0.5 mL of trioctylphosphine ("TOP") is rapidly injected thereto and reacted for 20 minutes. Acetone is added into the reaction solution which has been cooled to a room temperature and centrifuged to provide a precipitate, and the precipitate is dispersed into toluene. The obtained InP semiconductor nanocrystal exhibits an ultraviolet (UV) first absorption maximum wavelength within 420 nm to 600 nm.

2) Synthesis of InP/ZnS Core/Shell 1.2 mmoL (0.224 g) of zinc acetate, 2.4 mmol (0.757 g) of oleic acid, and 10 mL of trioctylamine are introduced into a reaction flask and subjected to vacuum at 120° C. for 10 minutes. The atmosphere of the reactor is replaced with nitrogen and the reactor is heated at 280° C. The InP semiconductor nanocrystal toluene dispersion obtained from the Reference Example is added thereto, and 2.4 mmol of sulfur/TOP ("S/TOP") is added and reacted for 120 minutes.

Example 1: Manufacture of Device

Figure 6:
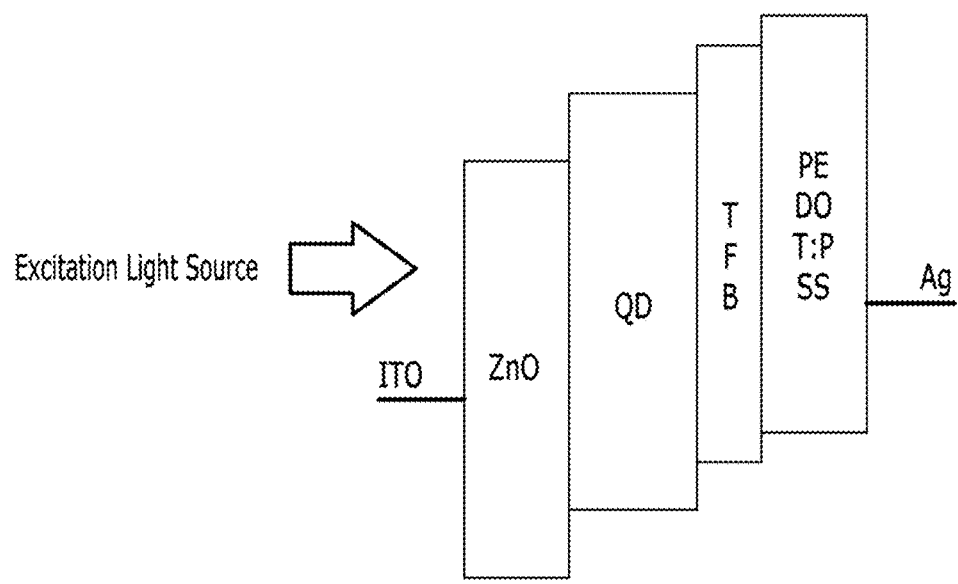
FIG. 6 is a schematic cross-sectional view of the electronic device according to Example 1.

The device shown in FIG. 6 is fabricated using quantum dots obtained as described in the Reference Example. ITO is deposited on the substrate, and PEDOT:PSS and TFB layers are coated thereon using a spin coating method. The quantum dots and a ZnO layer are formed on the obtained TFB layer by a spin coating process. A silver (Ag) electrode is formed on the ZnO layer using vacuum deposition.

The light emitting diode emitting a wavelength of 365 nm is disposed in front of the ITO electrode.

A voltage (4V) is applied between the ITO electrode and the Ag electrode while the light emitting diode (applied voltage: 2.7V) is operated to irradiate the quantum dot emission layer with light having a wavelength of 365 nm.

Figure 7:
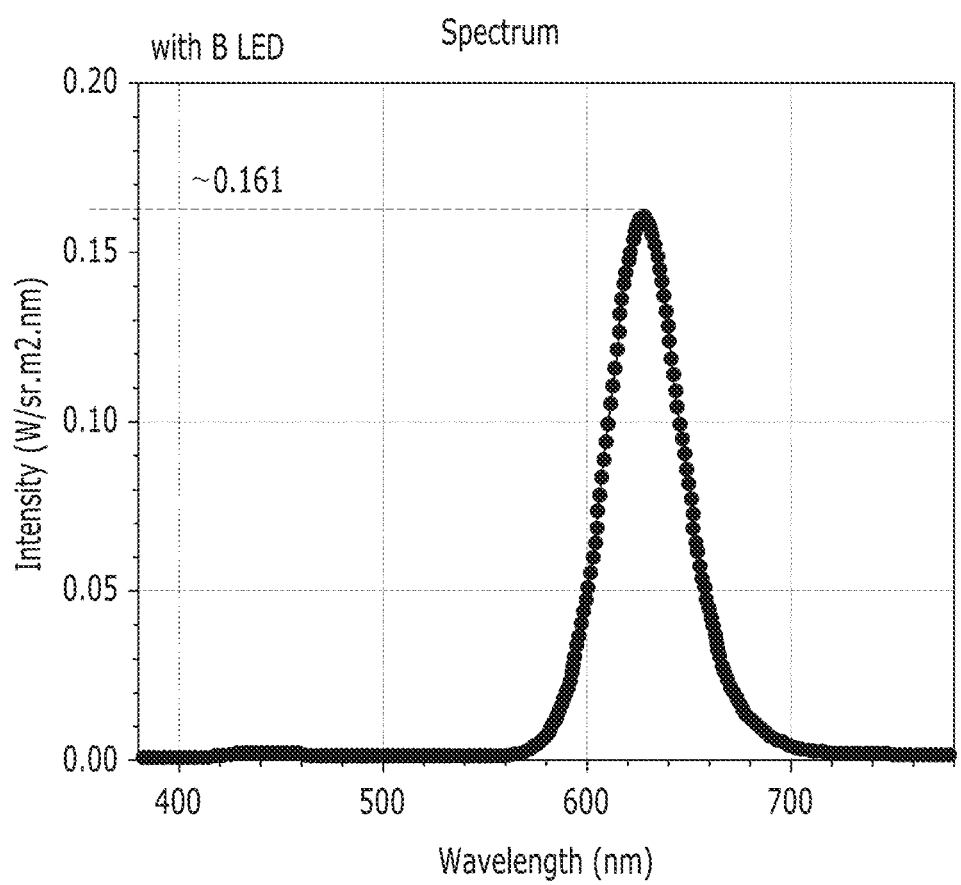
FIG. 7 is a graph of intensity (watt per steradian per square meter per nanometer, $W/sr.m^2.nm$) versus wavelength (nm), showing a light emitting intensity based upon a wavelength obtained when operating the electronic device according to Example 1.

The light emitted from the electronic device is measured for a luminance intensity with respect to a wavelength, and the results are shown in FIG. 7.

Comparative Example 1

Without operating the light emitting diode, a voltage of 4V is applied between the ITO electrode and the Ag electrode. The light emitted from the electronic device is measured for a luminance intensity with respect to a wavelength, and the results are shown in FIG. 8.

Figure 8:
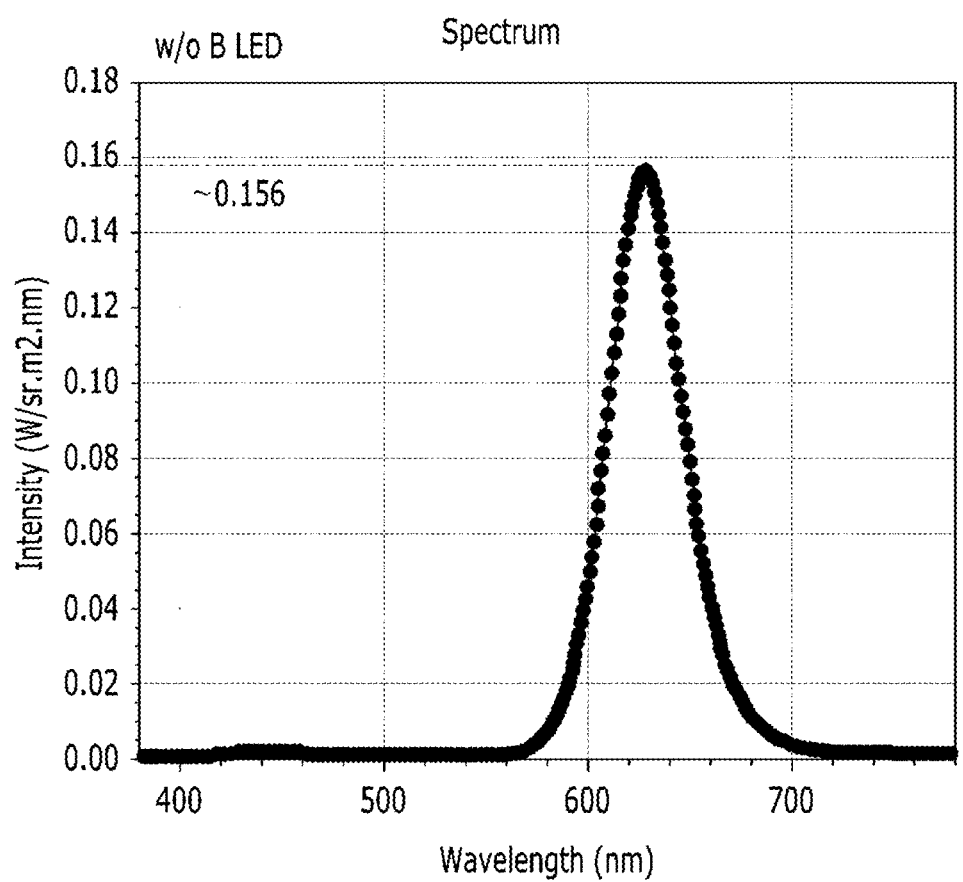
FIG. 8 is graph of intensity ($W/sr.m^2.nm$) versus wavelength (nm), showing a light emitting intensity based upon a wavelength obtained when operating the electronic device according to Comparative Example 1.

From the results shown in FIGS. 7 and 8, it is confirmed that the device of Example 1 may exhibit increased luminance, without substantially changing the light emitting wavelength of the device, as compared to that of Comparative Example 1.

While this disclosure has been described in connection with what is presently considered to be practical example embodiments, it is to be understood that the invention is not limited to the disclosed embodiments, but, on the contrary, is intended to cover various modifications and equivalent arrangements included within the spirit and scope of the appended claims.

What is claimed is:

1. An electronic device comprising:
   an anode and a cathode facing each other;
   a quantum dot emission layer disposed between the anode and the cathode and comprising a plurality of quantum dots; and
   an excitation light emitting source,
   wherein the quantum dot emission layer is configured to receive electrical energy from the anode and the cathode and to emit light having a first wavelength,
   wherein the quantum dot emission layer and the excitation light emitting source are configured so that the excitation light emitting source provides the quantum dot emission layer with light having a second wavelength of about 300 nanometers to about 490 nanometers, and the plurality of quantum dots in the quantum dot emission layer are excited by the light of the second wavelength and emit light having a third wavelength which is greater than the second wavelength,
   wherein the anode, the cathode, or a combination thereof is a light transmitting electrode,
   wherein the light having the first wavelength and the light having the third wavelength are emitted through the light transmitting electrode,
   wherein the excitation light emitting source comprises a light emitting transistor, and
   the light emitting transistor comprises a gate electrode, a channel overlapping at least a portion of the gate electrode and comprising an electroluminescence material, an insulator disposed between the gate electrode and the channel, and a source electrode and a drain electrode electrically connected with the channel.

2. The electronic device of claim 1, wherein the electronic device further comprises a first hole injection layer, a first hole transport layer, a first electron blocking layer, or a combination thereof disposed between the anode and the quantum dot emission layer, and the electronic device further comprises a first electron injection layer, a first electron transport layer, a first hole blocking layer, or a combination thereof disposed between the cathode and the quantum dot emission layer.

3. The electronic device of claim 1, wherein the excitation light emitting source is configured so that the light having the second wavelength passes through the light transmitting electrode before being provided to the quantum dot emission layer.

4. The electronic device of claim 1, wherein the gate electrode is a reflecting electrode.

5. The electronic device of claim 1, wherein the light having the first wavelength and the light having the third wavelength pass through the cathode,
   the anode comprises a first surface and a second surface opposite the first surface,
   the first surface of the anode faces the quantum dot emission layer, and
   the light emitting transistor is disposed on the second surface of the anode.

6. The electronic device of claim 5, wherein the light emitting transistor is configured so that charge transport occurs in a direction perpendicular to the first surface.

7. The electronic device of claim 1, wherein the light having the first wavelength and the light having the third wavelength pass through the cathode,
   the anode comprises a first surface and a second surface opposite the first surface,
   the first surface of the anode faces the quantum dot emission layer, and
   the second surface of the anode faces the channel of the light emitting transistor.

8. The electronic device of claim 7, wherein the light emitting transistor is configured so that charge transport occurs in a direction horizontal to the first surface.

9. The electronic device of claim 1, wherein the channel comprises a hole auxiliary layer facing the source electrode, an electron auxiliary layer facing the drain electrode, and an emission layer disposed between the hole auxiliary layer and the electron auxiliary layer and comprising the electroluminescence material.

10. The electronic device of claim 9, wherein the hole auxiliary layer comprises a second hole injection layer, a second hole transport layer, a second electron blocking layer, or a combination thereof,
    the electron auxiliary layer comprises a second electron injection layer, a second electron transport layer, a second hole blocking layer, or a combination thereof.

11. A display device comprising the electronic device of claim 1.

* * * * *